US010563014B2

(12) United States Patent
Malik et al.

(10) Patent No.: US 10,563,014 B2
(45) Date of Patent: Feb. 18, 2020

(54) DIELECTRIC FILM FORMING COMPOSITION

(71) Applicant: Fujifilm Electronic Materials U.S.A., Inc., N. Kingstown, RI (US)

(72) Inventors: Sanjay Malik, Attleboro, MA (US); William A. Reinerth, Riverside, RI (US); Binod B. De, Attleboro, MA (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

(21) Appl. No.: 15/907,332

(22) Filed: Feb. 28, 2018

(65) Prior Publication Data

US 2019/0077913 A1 Mar. 14, 2019

Related U.S. Application Data

(60) Provisional application No. 62/581,895, filed on Nov. 6, 2017, provisional application No. 62/556,723, filed on Sep. 11, 2017.

(51) Int. Cl.
| | | |
|---|---|---|
| *C08G 73/10* | (2006.01) |
| *C08J 5/18* | (2006.01) |
| *G03F 7/038* | (2006.01) |
| *G03F 7/16* | (2006.01) |
| *G03F 7/20* | (2006.01) |
| *G03F 7/38* | (2006.01) |
| *G03F 7/32* | (2006.01) |
| *G03F 7/40* | (2006.01) |
| *H01L 23/373* | (2006.01) |
| *H01L 21/02* | (2006.01) |
| *H01L 21/268* | (2006.01) |
| *H01L 21/311* | (2006.01) |
| *C08J 3/24* | (2006.01) |
| *G03F 7/004* | (2006.01) |
| *G03F 7/037* | (2006.01) |
| *C08F 222/10* | (2006.01) |
| *C09D 7/00* | (2018.01) |
| *G03F 7/025* | (2006.01) |
| *C08F 267/10* | (2006.01) |
| *G03F 7/027* | (2006.01) |
| *C09D 4/06* | (2006.01) |
| *C09D 179/08* | (2006.01) |
| *H01L 21/3213* | (2006.01) |
| *H01L 21/768* | (2006.01) |
| *H01L 23/522* | (2006.01) |
| *H01L 23/532* | (2006.01) |
| *C08K 3/36* | (2006.01) |
| *C08K 5/098* | (2006.01) |

(52) U.S. Cl.
CPC .... *C08G 73/1085* (2013.01); *C08F 222/1006* (2013.01); *C08F 267/10* (2013.01); *C08G 73/101* (2013.01); *C08G 73/1039* (2013.01); *C08G 73/1067* (2013.01); *C08G 73/1092* (2013.01); *C08J 3/24* (2013.01); *C08J 5/18* (2013.01); *C09D 4/06* (2013.01); *C09D 7/00* (2013.01); *C09D 179/08* (2013.01); *G03F 7/0042* (2013.01); *G03F 7/0047* (2013.01); *G03F 7/025* (2013.01); *G03F 7/027* (2013.01); *G03F 7/037* (2013.01); *G03F 7/0387* (2013.01); *G03F 7/162* (2013.01); *G03F 7/168* (2013.01); *G03F 7/2002* (2013.01); *G03F 7/202* (2013.01); *G03F 7/32* (2013.01); *G03F 7/38* (2013.01); *G03F 7/40* (2013.01); *H01L 21/02118* (2013.01); *H01L 21/02282* (2013.01); *H01L 21/268* (2013.01); *H01L 21/311* (2013.01); *H01L 21/31127* (2013.01); *H01L 21/32134* (2013.01); *H01L 21/76802* (2013.01); *H01L 21/76828* (2013.01); *H01L 21/76865* (2013.01); *H01L 21/76871* (2013.01); *H01L 21/76879* (2013.01); *H01L 23/3737* (2013.01); *H01L 23/5226* (2013.01); *H01L 23/53228* (2013.01); *C08J 2379/08* (2013.01); *C08K 3/36* (2013.01); *C08K 5/098* (2013.01); *C08K 2201/005* (2013.01); *H01L 23/5329* (2013.01)

(58) Field of Classification Search
None
See application file for complete search history.

(56) References Cited

U.S. PATENT DOCUMENTS

| | | |
|---|---|---|
| 5,280,013 A | 1/1994 | Newman et al. |
| 5,302,547 A | 4/1994 | Wojnarowski et al. |
| 5,397,863 A | 3/1995 | Afzali-Ardakani et al. |

(Continued)

FOREIGN PATENT DOCUMENTS

| | | | | |
|---|---|---|---|---|
| CN | 106832280 | 6/2017 | ............. | C08G 73/10 |
| EP | 1 956 616 | 8/2008 | ............... | H01G 4/33 |

OTHER PUBLICATIONS

The International Search Report and Written Opinion of the International Searching Authority for International Application No. PCT/US18/20118 dated Apr. 15, 2018.

(Continued)

*Primary Examiner* — Erik Kielin
(74) *Attorney, Agent, or Firm* — Fish & Richardson P.C.

(57) ABSTRACT

This disclosure relates to dielectric film forming composition containing at least one fully imidized polyimide polymer; at least one inorganic filler; at least one metal-containing (meth)acrylate compound; and at least one catalyst. The dielectric film formed by such a composition can have a relatively low coefficient of thermal expansion (CTE) and a relatively high optical transparency.

37 Claims, No Drawings

(56) References Cited

U.S. PATENT DOCUMENTS

| | | | |
|---|---|---|---|
| 5,578,697 A | 11/1996 | Kawamonzen et al. | |
| 6,159,611 A | 12/2000 | Lee et al. | |
| 6,183,588 B1 | 2/2001 | Kelly et al. | |
| 6,323,096 B1 | 11/2001 | Saia et al. | |
| 6,472,082 B2 | 10/2002 | Kodemura | |
| 7,682,972 B2 | 3/2010 | Hurwitz et al. | |
| 7,888,441 B2 | 2/2011 | Schwab | |
| 8,043,526 B2 | 10/2011 | Lin et al. | |
| 9,136,123 B2 | 9/2015 | Wang et al. | |
| 2002/0131247 A1 | 9/2002 | Cooray | |
| 2002/0155216 A1* | 10/2002 | Reitz | C03C 17/32 |
| | | | 427/240 |
| 2003/0007332 A1* | 1/2003 | Seki | H05K 3/381 |
| | | | 361/750 |
| 2003/0217462 A1 | 11/2003 | Wang et al. | |
| 2005/0040534 A1 | 2/2005 | Farnworth et al. | |
| 2006/0118830 A1 | 6/2006 | Brunner et al. | |
| 2006/0199886 A1 | 9/2006 | Ryang et al. | |
| 2008/0017308 A1* | 1/2008 | Dershem | C08F 212/14 |
| | | | 156/307.3 |
| 2009/0288764 A1 | 11/2009 | Arrington | |
| 2012/0127578 A1 | 5/2012 | Bright et al. | |
| 2013/0228901 A1* | 9/2013 | Dershem | H01L 21/02282 |
| | | | 257/632 |
| 2014/0274470 A1 | 9/2014 | Kim et al. | |
| 2016/0090513 A1 | 3/2016 | Zhang et al. | |
| 2016/0313642 A1 | 10/2016 | Malik et al. | |
| 2017/0152405 A1* | 6/2017 | Aoyama | C09J 4/00 |
| 2017/0152408 A1* | 6/2017 | Kirikae | C09J 7/255 |

OTHER PUBLICATIONS

Stadermann et al., "Fabrication of Large-area Free-standing Ultrathin Polymer Films", *Journal of Visualized Experiments*, vol. 100, pp. 1-7 (Jun. 3, 2015).

The Supplementary European Search Report for European Application No. EP 18 77 3067 dated Jun. 11, 2019.

The International Search Report and Written Opinion of the International Searching Authority for International Application No. PCT/US2018/020102 dated Apr. 27, 2018 (10 pages).

The Supplemental European Search Report for European Patent Application No. EP 18 77 3066 dated Apr. 1, 2019.

* cited by examiner

DIELECTRIC FILM FORMING COMPOSITION

CROSS-REFERENCE TO RELATED APPLICATIONS

The present application claims priority to U.S. Provisional Application Ser. No. 62/581,895, filed on Nov. 6, 2017, and U.S. Provisional Application Ser. No. 62/556,723, filed on Sep. 11, 2017. The prior applications are hereby incorporated by reference in their entirety.

BACKGROUND OF THE DISCLOSURE

The continued expansion of mobile computing applications requires the packing of ever growing levels of computing power in smaller device footprints. Designers of semiconductor devices are relying on the use of a variety of new chip architectures to meet the new device requirements. These new architectures pose significant challenges not only for the designers of new integrated circuits, but also for the designers of the packaging materials that will be used for these devices.

SUMMARY OF THE DISCLOSURE

Dielectric material requirements for packaging applications are continuously evolving as new, advanced devices are relying heavily on wafer and panel-level packaging (WLP and PLP) and 3D integration. One of the important requirements of dielectric films for advanced packaging designs is low coefficient of thermal expansion (CTE). In recent years, fillers such as silica particles have been used in the film-forming compositions to lower the CTE of the resulting film. The drawback to this approach is that as the amount of the filler is increased, the transparency of the film decreases and patterning of such a dielectric film by using actinic radiation becomes difficult. In addition, the mechanical properties of such a dielectric film suffer with the increase of the amount of the filler. This disclosure relates to novel compositions that surprisingly reduce the amount of CTE of the dielectric films formed while keeping the films transparent. In addition, the films thus formed retain their mechanical properties such as elongation to break and young modulus.

In one aspect, this disclosure features a dielectric film forming composition containing:
a) at least one fully imidized polyimide polymer;
b) at least one inorganic filler;
c) at least one metal-containing (meth)acrylate compound; and
d) at least one catalyst capable of inducing polymerization reaction.

In another aspect, this disclosure features a dielectric film (e.g., a self-standing film) formed by the composition described herein. In some embodiments, the dielectric film can include (e.g., before crosslinking): a) at least one fully imidized polyimide polymer; b) at least one inorganic filler; c) at least one metal-containing (meth)acrylate (e.g., an uncrosslinked metal-containing (meth)acrylate); and d) at least one catalyst capable of inducing polymerization reaction. In some embodiments, the dielectric film can include (e.g., after crosslinking): a) at least one fully imidized polyimide polymer; b) at least one inorganic filler; and c) at least one crosslinked metal-containing (meth)acrylates.

In another aspect, this disclosure features a dry film that includes a carrier substrate; and a dielectric film described herein supported by the carrier substrate.

In another aspect, this disclosure features a process for producing a patterned dielectric film that includes the steps of:
a) coating (e.g., by spin coating) the dielectric film forming composition described herein on a substrate to form a dielectric film; and
b) patterning the film by a laser ablation process or a lithography process to formed the patterned dielectric film.

In yet another aspect, this disclosure features a method for preparing a dry film structure. The method includes:
(A) coating a carrier substrate containing at least one plastic film with a dielectric film forming composition described herein;
(B) drying the coated composition to form the dielectric film; and
(C) optionally applying a protective layer to the dielectric film.

DETAILED DESCRIPTION OF THE DISCLOSURE

As used herein, the term "fully imidized" means the polyimide polymers of this disclosure are at least about 90% (e.g., at least about 95%, at least about 98%, at least about 99%, or about 100%) imidized. As used herein, metal-containing (meth)acrylates (MCA) refers to compounds containing a metal and (meth)acrylate ligands. The (meth)acrylate ligands of MCA are sufficiently reactive to enable the MCA to participate in free radical-induced crosslinking of the MCA-containing film. As used herein, the term "(meth)acrylates" include both acrylates and methacrylates. As used herein, the catalyst (e.g., an initiator) is a compound capable of inducing a polymerization or crosslinking reaction when exposed to heat and/or a source of radiation. As used herein, a crosslinker is a compound containing two or more alkenyl or alkynyl groups capable of a crosslinking or polymerization reaction in the presence of a catalyst.

In some embodiments, this disclosure features a dielectric film forming composition containing:
a) at least one fully imidized polyimide polymer;
b) at least one inorganic filler;
c) at least one metal-containing (meth)acrylate compound; and
d) at least one catalyst capable of inducing polymerization reaction.

In some embodiments, the at least one fully imidized polyimide polymer of the dielectric film forming composition is prepared by reaction of at least one diamine with at least one dicarboxylic acid dianhydride.

Examples of suitable diamines include, but are not limited to, 1-(4-aminophenyl)-1,3,3-trimethylindan-5-amine (alternative names including 4,4'-[1,4-phenylene-bis(1-methylethylidene)] bisaniline), 1-(4-aminophenyl)-1,3,3-trimethyl-2H-inden-5-amine, 1-(4-aminophenyl)-1,3,3-trimethylindan-5-amine, [1-(4-aminophenyl)-1,3,3-trimethyl-indan-5-yl]amine, 1-(4-aminophenyl)-2,3-dihydro-1,3,3-trimethyl-1H-inden-5-amine, 5-amino-6-methyl-1-(3'-amino-4'-methylphenyl)-1,3,3-trimethylindan, 4-amino-6-methyl-1-(3'-amino-4'-methylphenyl)-1,3,3-trimethylindan, 5,7-diamino-1,1-dimethylindan, 4,7-diamino-1,1-dimethylindan, 5,7-diamino-1,1,4-trimethylindan, 5,7-diamino-1,1,6-trimethylindan, 5,7-diamino-1,1-dimethyl-4-ethylindan, p-phenylenediamine, m-phenylenediamine, o-phenylenediamine, 3-methyl-1,2-benzene-diamine, 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,2-diaminocyclohexane, 1,4-diaminocyclohexane, 1,3-cyclohexanebis(methylamine), 5-amino-1,3,3-trimethyl cyclohexanemethanamine, 2,5-diaminobenzotrifluoride, 3,5-diaminobenzotrifluoride, 1,3-diamino-2,4,5,6-tetrafluorobenzene, 4,4'-oxydianiline, 3,4'-oxydianiline, 3,3'-oxydianiline, 3,3'-diaminodiphenylsulfone, 4,4'-diaminodiphenylsulfones, 4,4'-isopropylidenedianiline, 4,4'-diaminodiphenylmethane, 2,2-bis(4-aminophenyl)propane, 4,4' diaminodiphenyl propane, 4,4'-diaminodiphenyl sulfide, 4,4'-diaminodiphenylsulfone, 4-aminophenyl-3-aminobenzoate, 2,2'-dimethyl-4,4'-diaminobiphenyl, 3,3'-dimethyl-4,4'-diaminobiphenyl, 2,2'-bis (trifluoromethyl) benzidine, 3,3'-bis (trifluoromethyl) benzidine, 2,2-bis [4-(4-aminophenoxy phenyl)] hexafluoropropane, 2,2-bis (3-amino-4-methylphenyl)-hexafluoropropane, 2,2-bis(3-aminophenyl)-1,1,1,3,3,3-hexafluoropropane, 1,3-bis-(4-aminophenoxy) benzene, 1,3-bis-(3-aminophenoxy)benzene, 1,4-bis-(4-aminophenoxy)benzene, 1,4-bis-(3-aminophenoxy) benzene, 1-(4-aminophenoxy)-3-(3-aminophenoxy) benzene, 2,2'-bis-(4-phenoxyaniline)isopropylidene, bis(p-beta-amino-t-butylphenyl)ether, p-bis-2-(2-methyl-4-aminopentyl)benzene, p-bis(1,1-dimethyl-5-aminopentyl) benzene, 3,3'-dimethyl-4,4'-diaminobiphenyl, 4,4'-diaminobenzophenone, 3'-dichlorobenzidine, 2,2-bis [4-(4-aminophenoxy)phenyl] propane, 4,4'-[1,3-phenylenebis(1-methyl-ethylidene)] bisaniline, 4,4'-[1,4-phenylenebis(1-methyl-ethylidene)]bisaniline, 2,2-bis [4-(4-aminophenoxy) phenyl] sulfone, 2,2-bis [4-(3-aminophenoxy) benzene], 1,4-bis (4-aminophenoxy) benzene, 1,3-bis (4-aminophenoxy) benzene, (1,3'-bis (3-aminophenoxy) benzene, and 9H-fluorene-2,6-diamine. Any of these diamines can be used individually or in combination in any ratio as long as the resulting polyimide polymer satisfies the requirements of this disclosure.

Examples of tetracarboxylic acid dianhydride monomers include, but are not limited to, 1-(3',4'-dicarboxyphenyl)-1,3,3-trimethylindan-5,6-dicarboxylic acid dianhydride, 1-(3',4'-dicarboxyphenyl)-1,3,3-trimethylindan-6,7-dicarboxylic acid dianhydride, 1-(3',4'-dicarboxyphenyl)-3-methylindan-5,6-dicarboxylic acid dianhydride, 1-(3',4'-dicarboxyphenyl)-3-methylindan-6,7-dicarboxylic acid anhydride, pyrazine-2,3,5,6-tetracarboxylic dianhydride, thiophene-2,3,4,5-tetracarboxylic dianhydride, 2,3,5,6-pyridinetetracarboxylic acid dianhydride, norbornane-2,3,5,6-tetracarboxylic acid dianhydride, bicyclo[2.2.2]oct-7-ene-3,4,8,9-tetracarboxylic acid dianhydride, tetracyclo[4.4.1.0$^{2,5}$.0$^{7,10}$]undecane-1,2,3,4-tetracarboxylic acid dianhydride, 3,3',4,4'-benzophenone tetracarboxylic dianhydride, 3,3',4,4'-diphenylsulfone tetracarboxylic dianhydride, 3,3',4,4'-diphenyl ether tetracarboxylic dianhydride, 2,3,3',4'-diphenyl ether tetracarboxylic dianhydride, 2,2-[bis(3, 4-dicarboxyphenyl)] hexafluoropropane dianhydride, ethyleneglycol bis (anhydrotrimellitate), and 5-(2,5-dioxotetrahydro)-3-methyl-3-cyclohexene-1,2-dicarboxylic anhydride. More preferred tetracarboxylic acid dianhydride monomers include 2,2-[bis(3, 4-dicarboxyphenyl)] hexafluoropropane dianhydride, 3,3',4,4'-benzophenone tetracarboxylic dianhydride, 3,3',4,4'-diphenylsulfone tetracarboxylic dianhydride, and 3,3',4,4'-diphenyl ether tetracarboxylic dianhydride. Any of these tetracarboxylic acid dianhydride can be used individually or in combination in any ratio as long as the resulting polyimide polymer satisfies the requirements of this disclosure.

In general, the polyimide polymer thus formed can be soluble in an organic solvent. In some embodiments, the polyimide polymer can have a solubility in an organic solvent of at least about 50 mg/mL (e.g., at least about 100 mg/mL or at least about 200 mg/mL) at 25° C. Examples of organic solvents include, but are not limited to. lactones such as gamma-butyrolactone, ε-caprolactone, γ-caprolactone and δ-valerolactone, cycloketones such as cyclopentanone and cyclohexanone, linear ketones such as methyl ethyl ketone (MEK), esters such as n-butyl acetate, ester alcohol such as ethyl lactate, ether alcohols such as tetrahydrofurfuryl alcohol, glycol esters such as propylene glycol methyl ether acetate, and pyrrolidones such as n-methyl pyrrolidone.

In some embodiments, to synthesize the fully imidized polyimide (PI) polymer, a polyimide precursor polymer is prepared first. In some embodiments, the PI precursor polymer is a polyamic acid (PAA) polymer. In some embodiments, the PI precursor is a polyamic ester (PAE) polymer. In some embodiments, one or more diamine(s) are combined with one or more tetracarboxylic acid dianhydride(s) in at least one (e.g., two, three, or more) polymerization solvent to form a polyamic acid (PAA) polymer. In some embodiments, the PAA polymer formed is imidized, either chemically or thermally, to form a PI polymer. In some embodiments, the PAA polymer is end-capped by using an appropriate reagent during or after the polymer synthesis. In some embodiments, the PAA polymer formed is esterified to form a polyamic ester (PAE) polymer. In some embodiments, the PAE polymer is formed by combination of a tetracarboxylic half ester with one or more diamines in at least one polymerization solvent. In some embodiments, the PAE polymer is end-capped by using an appropriate agent. In some embodiments, an end-capped PI polymer is synthesized from a PAA polymer or a PAE polymer containing an end-cap group. In some embodiments, such a PI polymer is end-capped after imidization.

In some embodiments, a chemical imidizing agent (e.g., a dehydrating agent) is added to a PAA polymer to catalyze the ring-closing dehydration process of the polyamic acid groups to form imide functionalities, thereby forming a PI polymer. Examples of suitable dehydrating agents include, but are not limited to, trifluoromethanesulfonic acid, methanesulfonic acid, p-toluenesulfonic acid, ethanesulfonic acid, butanesulfonic acid, perfluorobutanesulfonic acid, acetic anhydride, propionic anhydride, and butyric anhydride. In addition, this dehydration process can be catalyzed by further addition of a basic catalyst. Examples of suitable basic catalysts include, but are not limited to, pyridine, triethylamine, tripropylamine, tributylamine, dicyclohexylmethylamine, 2,6-lutidine, 3,5-lutidine, picoline, 4-dimethylaminopyridine (DMAP) and the like.

Methods to synthesize end-capped and non-endcapped PI precursor polymers are well known to those skilled in the art. Examples of such methods are disclosed in, e.g., U.S. Pat. Nos. 2,731,447, 3,435,002, 3,856,752, 3,983,092, 4,026,876, 4,040,831, 4,579,809, 4,629,777, 4,656,116, 4,960,860, 4,985,529, 5,006,611, 5,122,436, 5,252,534, 5,478,915, 5,773,559, 5,783,656, 5,969,055, 9,617,386, and US application publication numbers US20040265731, US20040235992, and US2007083016, the contents of which are hereby incorporated by reference.

The polymerization solvent(s) for preparing PI polymers or their precursors is generally one or a combination of two or more polar, aprotic solvents. Suitable polar, aprotic solvents include, but are not limited to, dimethylformamide (DMF), dimethylacetamide (DMAc), N-formylmorpholine (NFM), N-methylpyrrolidinone (NMP), N-ethylpyrrolidinone (NEP), dimethylsulfoxide (DMSO), gamma-butyrolactone (GBL), hexamethyl phosphoric acid triamide (HMPT), tetrahydrofuran (THF), methyltetrahydrofuran, 1,4-dioxane and mixtures thereof.

In some embodiments, the weight average molecular weight (Mw) of the polyimide polymer described herein is at least about 5,000 Daltons (e.g., at least about 10,000 Daltons, at least about 20,000 Daltons, at least about 25,000 Daltons, at least about 30,000 Daltons, at least about 35,000 Daltons, at least about 40,000 Daltons, or at least about 45,000 Daltons) and/or at most about 100,000 Daltons (e.g., at most about 90,000 Daltons, at most about 80,000 Daltons at most about 70,000 Daltons, at most about 65,000 Daltons, at most about 60,000 Daltons, at most about 55,000 Daltons, or at most about 50,000 Daltons). In some embodiments, the weight average molecular weight (Mw) of the fully imidized polyimide polymer is from about 20,000 Daltons to about 70,000 Daltons or from about 30,000 Daltons to about 80,000 Daltons. The weight average molecular weight can be obtained by gel permeation chromatography methods and calculated using a polystyrene standard.

In some embodiments, the amount of polyimide (A) is at least about 3 weight % (e.g., at least about 6 weight %, at least about 9 weight %, at least about 12 weight %, or at least about 15 weight %) and/or at most about 40 weight % (e.g., at most about 35 weight %, at most about 30 weight %, at most about 25 weight %, or at most about 20 weight %) of the entire weight of the dielectric film forming composition. In some embodiments, the amount of polyimide (A) in the dielectric film forming composition is at least about 10 weight % (e.g., at least about 12.5 weight %, at least about 15 weight %, at least about 20 weight %, or at least about 25 weight %) and/or at most about 60 weight % (e.g., at most about 55 weight %, at most about 50 weight %, at most about 45 weight %, at most about 40 weight %, at most about 35 weight %, or at most about 30 weight %) of the amount of solid in the composition. The amount of solid in the composition refers to the entire weight of the composition minus the amount of solvent in the composition (i.e., the entire weight of the solid dielectric film formed by the composition).

In some embodiments, the inorganic filler in the dielectric film forming composition described herein can include an inorganic particle. In some embodiments, the inorganic particle is selected from the group consisting of silica, alumina, titania, zirconia, hafnium oxide, CdSe, CdS, CdTe, CuO, zinc oxide, lanthanum oxide, niobium oxide, tungsten oxide, strontium oxide, calcium titanium oxide, sodium titanate, barium sulfate, barium titanate, barium zirconate, and potassium niobate. Preferably, the inorganic fillers are in a granular form of an average size of about 0.1-2.0 microns. In some embodiments, the filler is an inorganic particle containing a ferromagnetic material. Suitable ferromagnetic materials include elemental metals (such as iron, nickel, and cobalt) or their oxides, sulfides and oxyhydroxides, and intermetallics compounds such as Awaruite ($Ni_3Fe$), Wairauite (CoFe), $Co_{17}Sm_2$, and $Nd_2Fe_{14}B$.

When the inorganic particle is silica, it may be hydrophilic or hydrophobic. Hydrophobic silica fillers can be produced by surface modification of hydrophilic, fumed silica or by direct formation of surface modified silica fillers. Direct formation of surface modified silica fillers is typically accomplished by hydrolytic condensation of functional silanes. Surface modified silica fillers useful in the present disclosure may have reactive and/or non-reactive groups on their surface. Fillers (e.g., silica fillers) useful in the present disclosure have particle sizes (e.g., mean particle sizes) of at most about 2 microns (e.g., at most about 1.5 microns, at most about 1 micron, at most about 0.75 microns, at most about 0.5 microns, at most about 0.25 microns, or at most about 0.2 microns) and/or at least about 0.1 microns (e.g., at least about 0.2 microns, at least about 0.3 microns, at least about 0.5 microns, or at least about 1 micron). The filler size distribution can be narrow (e.g., essentially monodisperse) or broad. The desired filler size and distribution can be achieved by any of a number of techniques known to those skilled in the art including, but not limited to, milling, grinding and filtration. In some embodiments, the silica fillers are dispersed in an organic solvent. Dispersion in a solvent can be accomplished by a variety of methods known to those skilled in the art including, but not limited to, media milling and high shear mixing. Solvents useful for dispersion of silica fillers are not particularly limited. Preferred solvents include esters, ethers, lactones, ketones, amides, and alcohols. More preferred solvents include GBL, cyclopentanone, cyclohexanone, ethyl lactate, and n-butanol In some embodiments, the amount of the filler (e.g., silica filler) in the dielectric film forming composition of this disclosure is at least about 2 weight % (e.g., at least about 4 weight %, at least about 6 weight %, at least about 8 weight %, or at least about 10 weight %) and/or at most about 20 weight % (e.g., at most about 18 weight %, at most about 15 weight %, or at most about 12 weight %) of the entire weight of the composition. In some embodiments, the amount of the filler (e.g., silica filler) in the dielectric film forming composition of this disclosure is at least about 5 weight % (e.g., at least about 10 weight %, at least about 14 weight %, at least about 17 weight %, or at least about 20 weight %) and/or at most about 40 weight % (e.g., at most about 35 weight %, at most about 30 weight %, or at most about 25 weight %) of the amount of solid in the composition. Without wishing to be bound by theory, it is believed that the presence of a filler (e.g., silica filler) can reduce the CTE of the dielectric film forming composition.

Metal-containing (meth)acrylates (MCAs) useful in the present disclosure generally have sufficient compatibility with other ingredients in the dielectric film-forming composition and are readily dispersed or dissolved in the composition upon mixing. The MCAs may be incorporated into the dielectric film forming composition as a solid or as a solution. In general, the MCA-containing compositions do not phase separate (i.e., become visibly heterogeneous) upon standing over the course of at least 24 hours at 25° C. In addition, dielectric films formed from the MCA-containing compositions are typically visibly clear and homogenous.

Suitable metal atoms useful for the MCAs in the present disclosure include titanium, zirconium, hafnium, and germanium. In some embodiments, the MCAs include at least one metal atom and at least one (e.g., one, two, three, or four) (meth)acrylate group. Preferred MCAs contain three or four (meth)acrylate groups attached to each metal atom. Examples of suitable MCAs include, but are not limited to, titanium tetra(meth)acrylate, zirconium tetra(meth)acrylate, hafnium tetra(meth)acrylate, titanium butoxide tri(meth)acrylate, titanium dibutoxide di(meth)acrylate, titanium tributoxide (meth)acrylate, zirconium butoxide tri(meth)acrylate, zirconium dibutoxide di(meth)acrylate, zirconium tributoxide (meth)acrylate, hafnium butoxide tri(meth)acrylate, hafnium dibutoxide di(meth)acrylate, hafnium tributoxide (meth)acrylate, titanium tetra(carboxyethyl (meth) acrylate), zirconium tetra(carboxyethyl (meth)acrylate), or hafnium tetra(carboxyethyl (meth)acrylate), titanium butoxide tri(carboxyethyl (meth)acrylate), titanium dibutoxide di(carboxyethyl (meth)acrylate), titanium tributoxide (carboxyethyl (meth)acrylate), zirconium butoxide tri(carboxyethyl (meth)acrylate), zirconium dibutoxide di(carboxyethyl (meth)acrylate), zirconium tributoxide (carboxyethyl (meth) acrylate), hafnium butoxide tri(carboxyethyl (meth)acrylate), hafnium dibutoxide di(carboxyethyl (meth)acrylate), or hafnium tributoxide (carboxyethyl (meth)acrylate). In general, the (meth)acrylate groups of the MCAs are sufficiently reactive to enable the MCAs to participate in crosslinking or polymerization of the MCA-containing film induced by free radicals, which may be generated by one or more catalysts present in the dielectric film forming composition. The crosslinking or polymerization can occur among at least two MCAs or among at least one MCA and at least one non-MCA crosslinker in the dielectric film forming composition. In some embodiments, an MCA is a crosslinker (e.g., when the MCA includes two or more (meth)acrylate groups). In some embodiments, an MCA is a monomer suitable for polymerization or function as a chain terminator (e.g., when the MCA includes only one (meth) acrylate group). In some embodiments, the MCA is not crosslinked (e.g., when the MCA includes only one (meth) acrylate group) in a crosslinked dielectric film formed by the compositions described herein.

In some embodiments, the amount of the MCA in the dielectric film forming composition is at least about 0.5 weight % (e.g., at least about 1 weight %, at least about 2 weight %, at least about 3 weight %, at least about 4 weight %, or at least about 5 weight %) and/or at most about 20 weight % (e.g., at most about 18 weight %, at most about 16 weight %, at most about 14 weight %, at most about 12 weight %, or at most about 10 weight %) of the entire weight of the composition. In some embodiments, the amount of the MCA in the dielectric film forming composition is at least about 1 weight % (e.g., at least about 2 weight %, at least about 4 weight %, at least about 6 weight %, at least about 8 weight %, or at least about 10 weight %) and/or at most about 25 weight % (e.g., at most about 20 weight %, at most about 18 weight %, at most about 16 weight %, at most about 14 weight %, or at most about 12 weight %) of the amount of solid in the composition.

It was surprisingly observed that the presence of at least one MCA and at least one inorganic filler in the dielectric film forming composition can greatly reduce the CTE while retaining optical transparency and toughness of the resulting film.

In some embodiments, the total amount of the MCA and inorganic filler is at least about 20 weight % (e.g., at least about 25 weight %, at least about 30 weight %, at least about 35 weight %) and/or at most about 50 weight % (e.g., at most about 45 weight %, at most about 40 weight %, at most about 35 weight %, or at most about 30 weight %) of the amount of solid in the dielectric film forming composition. Without wishing to be bound by theory, it is believed that, when the total amount of the MCA and inorganic filler is in the above ranges, the dielectric film thus formed can effectively achieve both a relatively low CTE and a relatively high optical transparency. Without wishing to be bound by theory, it is believed that if the total amount of the MCA and inorganic filler is less than 20% of the amount of solid in the composition, the resulting dielectric film may not have the desire CTE (e.g., CTE of less than 50 ppm/° C.). Further, without wishing to be bound by theory, if the total amount of the MCA and inorganic filler is more than 50% of the amount of solid in the composition, the resulting dielectric film may be brittle.

In some embodiments, the weight ratio between the inorganic filler and the MCA in the dielectric film forming composition is at least about 1:1 (e.g., at least about 1.5:1, at least about 2:1, at least about 2.5:1) and/or at most about 5:1 (e.g., at most about 4.5:1, at most about 4:1, at most about 3.5:1, or at most about 3:1). Without wishing to be bound by theory, it is believed that, when the weight ratio between the inorganic filler and the MCA is in the above ranges, the dielectric film thus formed can effectively achieve both a relatively low CTE and a relatively high optical transparency.

In some embodiments, the dielectric film forming composition of this disclosure can include at least one catalyst (e.g., an initiator). The catalyst is capable of inducing crosslinking or polymerization reaction when exposed to heat and/or a source of radiation.

In some embodiments, the catalyst used is a photoinitiator, where the photoinitiator is a compound capable of generating free radicals when exposed to high energy radiation. Non-limiting examples of high energy radiation include electron beams, ultraviolet light, and X-ray. Without wishing to be bound by theory, it is believed that the photoinitiator induces a crosslinking or polymerization reaction involving the (meth)acrylate groups of the MCA compound and/or other entities present in the composition that are capable of undergoing crosslinking or polymerization reaction. Examples of such entities include crosslinkers (e.g., non-MCA crosslinkers) and polyimides bearing alkenyl and alkynyl functional groups.

Specific examples of photoinitiators include, but are not limited to, 1,8-octanedione, 1,8-bis[9-(2-ethylhexyl)-6-nitro-9H-carbazol-3-yl]-1,8-bis(O-acetyloxime), 2-hydroxy-2-methyl-1-phenylpropan-1-one, 1-hydroxycyclohexyl phenyl ketone (Irgacure 184 from BASF), a blend of 1-hydroxycyclohexylphenylketone and benzophenone (Irgacure 500 from BASF), 2,4,4-trimethylpentyl phosphine oxide (Irgacure 1800, 1850, and 1700 from BASF), 2,2-dimethoxyl-2-acetophenone (Irgacure 651 from BASF), bis (2,4,6-trimethyl benzoyl)phenyl phosphine oxide (Irgacure 819 from BASF), 2-methyl-1-[4-(methylthio)phenyl]-2-morphorinopropane-1-on (Irgacure 907 from BASF), (2,4, 6-trimethylbenzoyl)diphenyl phosphine oxide (Lucerin TPO from BASF), 2-(Benzoyloxyimino)-1-[4-(phenylthio)phenyl]-1-octanone (Irgacure OXE-01 from BASF), 1-[9-Ethyl-6-(2-methylbenzoyl)-9H-carbazol-3-yl]ethanone 1-(O-acetyloxime) (Irgacure OXE-2 from BASF), ethoxy(2,4,6-trimethylbenzoyl)phenyl phosphine oxide (Lucerin TPO-L from BASF), a blend of phosphine oxide, hydroxy ketone and a benzophenone derivative (ESACURE KT046 from Arkema), 2-hydroxy-2-methyl-1-phenylpropane-1-on (Darocur 1173 from Merck), 2-(benzoyloxyimino)-1-[4-(phenylthio)phenyl]-1-octanone (OXE-01, available from BASF), 1-(O-acetyloxime)-1-[9-ethyl-6-(2-methylbenzoyl)-9H-carbazol-3-yl]ethanone (OXE-02, available from BASF), NCI-831 (ADEKA Corp.), NCI-930 (ADEKA Corp.), N-1919 (ADEKA Corp.), benzophenone, 2-chlorothioxanthone, 2-methylthioxanthone, 2-isopropylthioxanthone, benzodimethyl ketal, 1,1,1-trichloroacetophenone, diethoxyacetophenone, m-chloroacetophenone, propiophenone, anthraquinone, dibenzosuberone and the like.

Specific examples of nonionic-type photoinitiators include (5-toluylsulfonyloxyimino-5H-thiophen-2-ylidene)-2-methylphenyl-acetonitrile (Irgacure 121 from BASF), phenacyl p-methylbenzenesulfonate, benzoin p-toluenesulfonate, (p-toluene-sulfonyloxy)methylbenzoin, 3-(p-toluenesulfonyloxy)-2-hydroxy-2-phenyl-1-phenylpropyl ether, N-(p-dodecylbenzenesulfonyloxy)-1,8-naphthalimide, N-(phenyl-sulfonyloxy)-1,8-napthalimide, bis(cyclohexylsulfonyl)diazomethane, 1-p-toluenesulfonyl-1-cyclohexylcarbonyldiazomethane, 2-nitrobenzyl p-toluenesulfonate, 2,6-dinitrobenzyl p-toluenesulfonate, and 2,4-dinitrobenzyl p-trifluoromethylbenzenesulfonate and the like.

In some embodiments, a photosensitizer can be used in the dielectric film-forming composition where the photosensitizer can absorb light in the wavelength range of 193 to 405 nm. Examples of photosensitizers include, but are not limited to, 9-methylanthracene, anthracenemethanol, acenaphthylene, thioxanthone, methyl-2-naphthyl ketone, 4-acetylbiphenyl, and 1,2-benzofluorene.

In embodiments where the crosslinking or polymerization reaction is initiated by heat, the catalyst used is a thermal initiator where the thermal initiator is a compound capable of generating free radicals when exposed to a temperature from about 70° C. to about 250° C. Without wishing to be bound by theory, it is believed that the thermal initiator induces a crosslinking or polymerization reaction involving (meth)acrylate groups of the MCA compound and/or other entities present in the composition that are capable of undergoing crosslinking or polymerization reaction. Examples of such entities include crosslinkers (e.g., non-MCA crosslinkers) and polyimides bearing alkenyl and alkynyl functional groups.

Specific examples of thermal initiators include, but are not limited to, benzoyl peroxide, cyclohexanone peroxide, lauroyl peroxide, tert-amyl peroxybenzoate, tert-butyl hydroperoxide, di(tert-butyl)peroxide, dicumyl peroxide, cumene hydroperoxide, succinic acid peroxide, di(n-propyl) peroxydicarbonate, 2,2-azobis(isobutyronitrile), 2,2-azobis(2,4-dimethylvaleronitrile), dimethyl-2,2-azobisisobutyrate, 4,4-azobis(4-cyanopentanoic acid), azobiscyclohexanecarbonitrile, 2,2-azobis(2-methylbutyronitrile) and the like.

In some embodiments, a combination of two or more catalysts can be used in the dielectric film-forming composition. The combination of catalysts can be all thermal initiators, all photoinitiators, or a combination of at least one thermal initiator and at least one photoinitiator.

In some embodiments, the amount of catalyst in the dielectric film forming composition is at least about 0.25 weight % (e.g., at least about 0.5 weight %, at least about 0.75 weight %, at least about 1.0 weight %, or at least about 1.5 weight %) and/or at most about 4.0 weight % (e.g., at most about 3.5 weight %, at most about 3.0 weight %, at most about 2.5 weight %, or at most about 2.0 weight %) of the entire weight of the composition. In some embodiments, the amount of catalyst in the dielectric film forming composition is at least about 0.5 weight % (e.g., at least about 1.0 weight %, at least about 1.5 weight %, at least about 2.0 weight %, or at least about 2.5 weight %) and/or at most about 5.0 weight % (e.g., at most about 4.5 weight %, at most about 4.0 weight %, at most about 3.5 weight %, or at most about 3.0 weight %) of the amount of solid in the composition.

The dielectric film forming compositions of this disclosure can optionally contain at least one organic solvent. In some embodiments, the organic solvent is environmental friendly and practical to use in electronic packaging manufacturing. In some embodiments, the organic solvent can have boiling point of at most about 210° C. (e.g., at most about 200° C., at most about 190° C., at most about 180° C., at most about 170° C., at most about 160° C., or at most about 150° C.) to ensure that residual solvent after dry film formation is below 5% and the speed of drying film is more than about 2 feet per minute (e.g., about 3 feet per minute, about 4 feet per minute, about 5 feet per minute, or about 6 feet per minute). In some embodiments, the inorganic particles employed in the film forming composition can be easily dispersed in the organic solvent to form a homogeneous film. In some embodiments, a homogeneous film does not show any agglomeration of inorganic particles and is free from haze. In some embodiments, the polyimide polymer can have a solubility of at least about 50 mg/mL (e.g., at least about 100 mg/mL or at least about 200 mg/mL) at 25° C. in the organic solvent. Examples of organic solvents include, but are not limited to, lactones such as gamma-butyrolactone, cycloketones such as cyclopentanone and cyclohexanone, linear ketones such as methyl ethyl ketone (MEK), esters such as n-butyl acetate, ester alcohols such as ethyl lactate, ether alcohols such as tetrahydrofurfuryl alcohol, amides such as N,N-dimethylacetamide, sulfoxides such as dimethylsulfoxide (DMSO), ethers such as tetrahydrofuran (THF), pyrrolidones such as n-methyl pyrrolidone, and glycol esters such as propylene glycol methyl ether acetate. Preferred solvents include gamma-butyrolactone, cyclopentanone, cyclohexanone or a mixture thereof. In some embodiments, the organic solvent can include an aromatic solvent such as xylene, toluene, ethyl benzene, mesitylene and anisole. The above organic solvents can be used individually or in combination as long as it fully dissolves all components of the composition, with the exception of insoluble filler, cast a good film and does not interfere with the combining reaction.

In some embodiments, the amount of the organic solvent in the dielectric film forming composition is at least about 35 weight % (e.g., at least about 40 weight %, at least about 45 weight %, at least about 50 weight %, at least about 55 weight %, at least about 60 weight %, or at least about 65 weight %) and/or at most about 98 weight % (e.g., at most about 95 weight %, at most about 90 weight %, at most about 85 weight %, at most about 80 weight %, at most about 75 weight % or at most about 70 weight %) of the entire weight the dielectric film forming composition.

In some embodiments, the dielectric film forming composition of this disclosure can further include at least one crosslinker (e.g., a non-MCA crosslinker). In some embodiments, the crosslinker contains two or more alkenyl or alkynyl groups. In general, the crosslinker can be capable of undergoing a crosslinking or polymerization reaction in the presence of a catalyst.

In some embodiments, the at least one crosslinker is at least one urethane acrylate oligomer. The term "urethane acrylate oligomer" refers to a class of urethane (meth)acrylate compounds that contain urethane linkages and have (meth)acrylate (e.g., acrylate or methacrylate) functional groups such as urethane multi(meth)acrylate, multiurethane (meth)acrylate, and multiurethane multi(meth)acrylate. Types of urethane (meth)acrylate oligomers have been described by, for example, Coady et al., U.S. Pat. No. 4,608,409 and by Chisholm et al., U.S. Pat. No. 6,844,950, the contents of which are hereby incorporated by reference. Specific examples of urethane acrylate oligomers useful in the present disclosure include, but are not limited to, CN9165US, CN9167US, CN972, CN9782, CN9783 and CN992. These and other urethane acrylate oligomers are commercially available from Arkema (Sartomer).

In some embodiments, the crosslinker contains at least two (meth)acrylate groups. In some embodiments, the crosslinker is selected from the group consisting of 1,6-hexanediol di(meth)acrylate, tetraethyleneglycol di(meth)acrylate, 1,12-dodecanediol di(meth)acrylate, 1,3-butylene glycol di(meth)acrylate, 1,4-butanediol di(meth)acrylate, cyclohexane dimethanol di(meth)acrylate, polyethylene glycol di(meth)acrylate, propoxylated (3) glycerol tri(meth)acrylate, divinylbenzene, ethoxylated bisphenol-A-di(meth) acrylate, diethylene glycol bis(allyl carbonate), trimethylolpropane tri(meth)acrylate, ditrimethylolpropane tetra(meth) acrylate, pentaerythritol tri(meth)acrylate, pentaerythritol tetra(meth)acrylate, dipentaerythritol penta-/hexa-(meth) acrylate, isocyanurate tri(meth)acrylate, bis(2-hydroxyethyl)-isocyanurate di(meth)acrylate, 1,3-butanediol tri (meth)acrylate, 1,4-butanediol tri(meth)acrylate, neopentyl glycol di(meth)acrylate, (meth)acrylate modified-ureaformaldehyde resins, (meth)acrylate modified melamineformaldehyde resins and (meth)acrylate modified cellulose.

In some embodiments, the amount of the crosslinker in the dielectric film forming composition is at least about 2.5 weight % (e.g., at least about 5 weight %, at least about 7.5 weight %, at least about 10 weight %, at least about 12.5 weight %, or at least about 15 weight %) and/or at most about 30 weight % (e.g., at most about 27.5 weight %, at most about 25 weight %, at most about 22.5 weight %, at most about 20 weight %, or at most about 17.5 weight %) of the entire weight of the composition. In some embodiments, the amount of the crosslinker in the dielectric film forming composition is about 5 weight % (e.g., at least about 10 weight %, at least about 15 weight %, at least about 20 weight %, at least about 25 weight %, or at least about 30 weight %) and/or at most about 60 weight % (e.g., at most about 55 weight %, at most about 50 weight %, at most about 45 weight %, at most about 40 weight %, or at most about 35 weight %) of the amount of solid in the composition. Without wishing to be bound by theory, it is believed that the crosslinker can improve the mechanical properties and chemical resistance of the dielectric film formed by the compositions described herein.

The dielectric film forming composition of this disclosure can optionally include one or more other components such as adhesion promoters, fillers, surfactants, plasticizers, colorants, and dyes.

In some embodiments, the dielectric film forming composition of this disclosure further includes one or more adhesion promoter. Suitable adhesion promoters are described in "Silane Coupling Agent" Edwin P. Plueddemann, 1982 Plenum Press, New York. Classes of adhesion promoters include, but are not limited to, mercaptoalkoxysilanes, aminoalkoxysilanes, epoxyalkoxysilanes, glycidyloxyalkoxysilanes, mercaptosilanes, cyanatosilanes and imidazole silanes. In some embodiments, the adhesion promoter contains both an alkoxysilyl group and a functional group containing carbon-carbon multiple bond selected from substituted or unsubstituted alkenyl groups and substituted or unsubstituted alkynyl groups.

The amount of the optional adhesion promoter in the dielectric film forming composition, if employed, is at least about 0.3 weight % (e.g., at least about 0.5 weight %, at least about 0.7 weight %, or at least about 1 weight %) and/or at most about 4 weight % (e.g., at most about 3 weight %, at most about 2 weight %, or at most about 1.5 weight %) of the entire weight of the composition. In some embodiments, the amount of the optional adhesion promoter in the dielectric film forming composition is at least about 0.5 weight % (e.g., at least about 1 weight %, at least about 2 weight %, or at least about 2.5 weight %) and/or at most about 8 weight % (e.g., at most about 6 weight %, at most about 5 weight %, at most about 4 weight %, or at most about 3 weight %) of the amount of solid in the composition.

The dielectric film forming composition of this disclosure can also optionally contain one or more surfactant. If a surfactant is employed, the amount of the surfactant is at least about 0.001 weight % (e.g., at least about 0.01 weight % or at least about 0.1 weight %) and/or at most about 2 weight % (e.g., at most about 1 weight % or at most about 0.5 weight %) of the entire weight of the composition. In some embodiments, the amount of the surfactant is at least about 0.002 weight % (e.g., at least about 0.02 weight % or at least about 0.2 weight %) and/or at most about 4 weight % (e.g., at most about 1 weight % or at most about 0.5 weight %) of the amount of solid in the composition. Examples of suitable surfactants include, but are not limited to, the surfactants described in JP-A-62-36663, JP-A-61-226746, JP-A-61-226745, JP-A-62-170950, J P-A-63-34540, JP-A-7-230165, J P-A-8-62834, J P-A-9-54432 and J P-A-9-5988.

The dielectric film forming composition of the present disclosure can optionally contain one or more plasticizers. The amount of the optional plasticizer, if employed, is at least about 1 weight % (e.g., at least about 2 weight % or at least about 3 weight %) and/or at most about 10 weight % (e.g., at most about 7.5 weight % or at most about 5 weight %) of the entire weight of the composition. In some embodiments, the amount of the optional plasticizer is at least about 2 weight % (e.g., at least about 4 weight % or at least about 6 weight %) and/or at most about 20 weight % (e.g., at most about 14 weight % or at most about 10 weight %) of the amount of solid in the composition.

The dielectric film forming composition of the present disclosure can optionally contain one or more copper passivation reagent. Examples of copper passivation reagents include triazole compounds, imidazole compounds and tetrazole compounds. Triazole compounds can include triazoles, benzotriazoles, substituted triazoles, and substituted benzotriazoles. Examples of substituents include $C_1$-$C_8$ alkyl, amino, thiol, mercapto, imino, carboxy and nitro groups. Specific examples of triazole compounds include benzotriazole, 1,2,4-triazole, 1,2,3-triazole, tolyltriazole, 5-methyl-1,2,4-triazole, 5-phenyl-benzotriazole, 5-nitrobenzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiolbenzotriazole, halo-benzotriazoles (halo=F, Cl, Br or I), naphthotriazole, and the like. Examples of imidazole compounds include, but are not limited to, 2-alkyl-4-methyl imidazole, 2-phenyl-4-alkyl imidazole, 2-methyl-4(5)-nitroimidazole, 5-methyl-4-nitroimidazole, 4-imidazolemethanol hydrochloride, 2-mercapto-1-methylimidazole. Examples of tetrazole compounds include, but are not limited to, 1-H-tetrazole, 5-methyl-1H-tetrazole, 5-phenyl-1H-tetrazole, 5-amino-1H-tetrazole, 1-phenyl-5-mercapto-1H-tetrazole, 5,5'-bis-1H-tetrazole, 1-methyl-5-ethyltetrazole, 1-methyl-5-mercaptotetrazole, 1-carboxymethyl-5-mercaptotetrazole, and the like.

In some embodiments, the amount of the optional copper passivation agent, if employed, is at least about 0.01 weight % (e.g. at least about 0.05 weight % at least about 0.1 weight % or at least about 0.5 weight %) and/or at most about 2 weight % (e.g., at most about 1.5 weight % or at most about 1 weight %) of the entire weight of the dielectric film forming composition. In some embodiments, the amount of the optional copper passivation agent is at least about 0.02 weight % (e.g., at least about 0.1 weight %, at least about 0.2 weight % or at least about 1 weight %) and/or at most about 4 weight % (e.g., at most about 3 weight % or at most about 2 weight %) of the amount of solid in the composition.

In some embodiments, the polyimide can be prepared from diamines excluding the siloxane diamine of Structure (I)

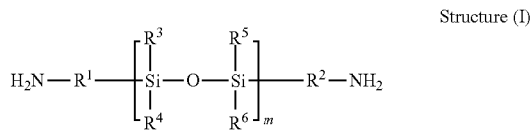

Structure (I)

in which $R^1$ and $R^2$ are each independently a divalent aliphatic or aromatic group (e.g., a $C_{1-6}$ divalent aliphatic group or a $C_{6-12}$ divalent aromatic group), $R^3$, $R^4$, $R^5$ and $R^6$ are each independently a monovalent aliphatic or aromatic group (e.g., a $C_{1-6}$ monovalent aliphatic group or a $C_{6-12}$ monovalent aromatic group), and m is an integer of 1-100.

Examples of monomer of siloxane diamines of structure (III) include, but are not limited to:

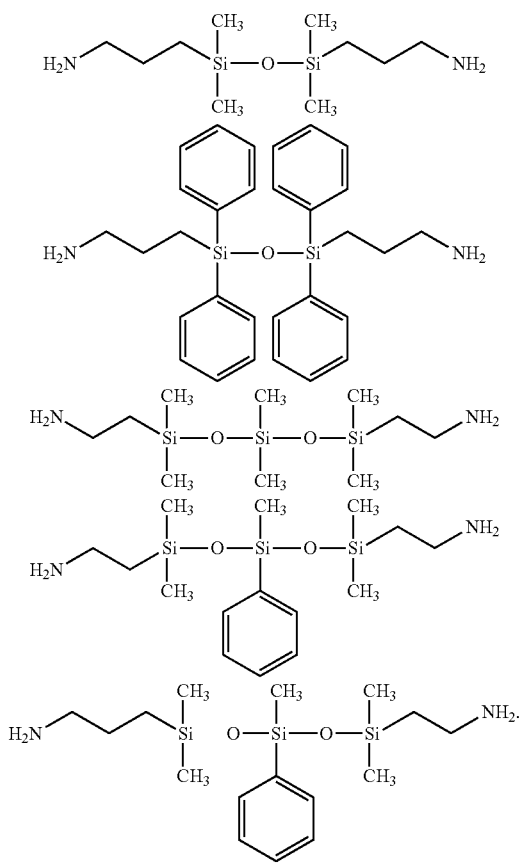

In some embodiments, the dielectric film forming compositions of the present disclosure may specifically exclude one or more of the following solvents, in any combination, if more than one. Such solvents can be selected from the group consisting of linear ketones such as methyl ethyl ketone (MEK), esters such as ethyl acetate, ester alcohols such as ethyl lactate, ether alcohols such as tetrahydrofurfuryl alcohol, and glycol esters such as propylene glycol methyl ether acetate (PGMEA).

In some embodiments, the dielectric film forming compositions of the present disclosure may specifically exclude one or more of the following adhesion promoters, in any combination, if more than one. Such adhesion promoters can be selected from the group consisting of primary amine containing adhesion promoters (such as 3-aminopropyl triethoxysilane and m-aminophenyl triethoxysilane), secondary amine containing adhesion promoters (such as N-cyclohexylamino trimethoxysilane), tertiary amine containing adhesion promoters (such as diethylaminoethyl triethoxysilane), urea containing adhesion promoters (such as ureidopropyl trimethoxysilane), anhydride containing adhesion promoters (such as 3-(triethoxysilyl)propyl succinic anhydride), epoxy containing adhesion promoters (such as 2-(3, 4-epoxycyclohexyl)ethyl triethoxysilane), isocyanato containing adhesion promoters (such as 3-isocyanatopropyltriethoxy silane), and sulfur containing adhesion promoters (such as 3-mercaptopropyl trimethoxysilane).

In some embodiments, the dielectric film forming compositions of the present disclosure may specifically exclude one or more of the additive components, in any combination, if more than one. Such components can be selected from the group consisting of non-polyimide polymers, non-crosslinking non-polyimide polymers, surfactants, plasticizers, colorants, dyes, water, oxygen scavengers, quaternary ammonium hydroxides, amines, alkali metal and alkaline earth bases (such as NaOH, KOH, LiOH, magnesium hydroxide, and calcium hydroxide), fluoride containing monomeric compounds, oxidizing agents (e.g., peroxides, hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, and peracetic acid), abrasives, silicates, corrosion inhibitors (e.g., non-azole corrosion inhibitors), guanidine, guanidine salts, inorganic acids (e.g., sulfonic acids, sulfuric acid, sulfurous acid, nitrous acid, nitric acid, phosphorous acid, and phosphoric acid), organic acids (e.g., hydroxycarboxylic acids and carboxylic and polycarboxylic acids), pyrrolidone, polyvinyl pyrrolidone, and metal halides.

In some embodiments, this disclosure features a dielectric film formed by the dielectric film forming composition described herein. In some embodiments, when the dielectric film is not yet crosslinked by exposing to a source of radiation or heat, the dielectric film can include: a) at least one fully imidized polyimide polymer; b) at least one inorganic filler; c) at least one metal-containing (meth) acrylates; and d) at least one catalyst. In some embodiments, the dielectric film can further include at least one crosslinker (such as those described above with respect to the dielectric film forming composition).

In some embodiments, when the dielectric film has been crosslinked by exposing to a source of radiation or heat, the dielectric film can include a) at least one fully imidized polyimide polymer; b) at least one inorganic filler; and c) at least one crosslinked metal-containing (meth)acrylate. In some embodiments, the at least one fully imidized polyimide polymer in the crosslinked dielectric film can be uncrosslinked. In some embodiments, the at least one fully imidized polyimide polymer in the crosslinked dielectric film can be crosslinked (e.g., with itself or with the metal-containing (meth)acrylate). In such embodiments, the at least one fully imidized polyimide polymer in the dielectric film forming composition may contain one or more double or triple bonds (e.g., an end-capping group).

In some embodiments, this disclosure features a method of preparing a dry film structure. The method includes:

(A) coating a carrier substrate (e.g., a substrate including at least one plastic film) with a dielectric film forming composition described herein (e.g., a composition containing: a) at least one fully imidized polyimide polymer; b) at least one inorganic filler; c) at least one metal-containing (meth)acrylate; d) at least one catalyst; e) optionally at least one solvent, and f) optionally at least one crosslinker to form a coated composition;

(B) drying the coated composition to form a dielectric film; and (C) optionally applying a protective layer to the dielectric film.

In some embodiments, the carrier substrate is a single or multiple layer plastic film, which can include one or more polymers (e.g., polyethylene terephthalate). In some embodiments, the carrier substrate has excellent optical transparency and it is substantially transparent to actinic irradiation used to form a relief pattern in the polymer layer. The thickness of the carrier substrate is preferably in the range of at least about 10 µm (e.g., at least about 15 µm, at least about 20 µm, at least about 30 µm, at least about 40 µm, at least about 50 µm or at least about 60 µm) to at most about 150 µm (e.g., at most about 140 µm, at most about 120 µm, at most about 100 µm, at most about 90 µm, at most about 80 µm, or at most about 70 µm).

In some embodiments, the protective layer substrate is a single or multiple layer film, which can include one or more polymers (e.g., polyethylene or polypropylene). Examples of carrier substrates and protective layers have been described in, e.g., U.S. Application Publication No. 2016/0313642, the contents of which are hereby incorporated by reference. In some embodiments, the dielectric film in the dry film structure has not yet been exposed to a source of radiation or heat to, e.g., form a crosslinked film.

In some embodiments, the dielectric film of the dry film can be delaminated from carrier layer as a self-standing dielectric film. A self-standing dielectric film is a film that can maintain its physical integrity without using any support layer such as a carrier layer. In some embodiments, the self-standing dielectric film can include (e.g., before crosslinking): a) at least one fully imidized polyimide polymer; b) at least one inorganic filler; c) at least one metal-containing (meth)acrylate (e.g., an uncrosslinked metal-containing (meth)acrylate); and d) at least one catalyst capable of inducing polymerization reaction. In some embodiments, the self-standing dielectric film can be exposed to a source of radiation or heat to form a crosslinked self-standing dielectric film. In some embodiments, the crosslinked self-standing dielectric film can include: a) at least one fully imidized polyimide polymer; b) at least one inorganic filler; and c) at least one crosslinked metal-containing (meth)acrylates. In some embodiments, the self-standing dielectric film (either crosslinked or uncrosslinked) can be laminated to a substrate (e.g., a semiconductor substrate) using a vacuum laminator at about 50° C. to about 140° C. after pre-laminating of the dielectric film with a plane compression method or a hot roll compression method.

In some embodiments, the dielectric film of the dry film structure can be laminated to a substrate (e.g., a semiconductor substrate) using a vacuum laminator at about 50° C. to about 140° C. after pre-laminating of the dielectric film of the dry film structure with a plane compression method or a hot roll compression method. When the hot roll lamination is employed, the dry film structure can be placed into a hot roll laminator, the optional protective layer can be peeled away from the dielectric film/carrier substrate, and the dielectric film can be brought into contact with and laminated to a substrate using rollers with heat and pressure to form an article containing the substrate, the dielectric film, and the carrier substrate. The dielectric film can then be exposed to a source of radiation or heat (e.g., through the carrier substrate) to form a crosslinked dielectric film. In some embodiments, the carrier substrate can be removed before exposing the dielectric film to a source of radiation or heat.

In some embodiments, a crosslinked dielectric film is prepared from a dielectric film forming composition of this disclosure by a process containing the steps of:

a) coating the dielectric film forming composition described herein on a substrate (e.g. a semiconductor substrate) to form a dielectric film;

b) optionally baking the film at a temperature from about 50° C. to about 150° C. for about 20 seconds to about 240 seconds; and c) exposing the dielectric film to a source of radiation or heat.

Coating methods for preparation of the dielectric film include, but are not limited to, spin coating, spray coating, roll coating, rod coating, rotation coating, slit coating, compression coating, curtain coating, die coating, wire bar coating, knife coating and lamination of dry film. Semiconductor substrates could have circular shape such as wafers or could be panels. In some embodiments, semiconductor substrates could be a silicon substrate, a copper substrate, an aluminum substrate, a silicon oxide substrate, a silicon nitride substrate, a glass substrate, an organic substrate, a copper cladded laminate or a dielectric material substrate.

Film thickness of the dielectric film of this disclosure is not particularly limited. In some embodiments, the dielectric film has a film thickness of at least about 3 microns (e.g., at least about 4 microns, at least about 5 microns, at least about 7 microns, at least about 10 microns, at least about 15 microns, at least about 20 microns, or at least about 25 microns) and/or at most about 100 microns (e.g., at most about 80 microns, at most about 60 microns, at most about 50 microns, at most about 40 microns, or at most about 30 microns).

In some embodiments, the dielectric film can have a relatively small film thickness (e.g., at most about 5 microns, at most about 4 microns, or at most about 3 microns).

The dielectric film then can be exposed to a source of radiation or to heat (e.g., to form a crosslinked film). Non-limiting examples of radiation used for radiation exposure include electron beams, ultraviolet light and X-ray, with ultraviolet light being preferable. Typically, a low-pressure mercury lamp, a high-pressure mercury lamp, an extra-high-pressure mercury lamp, or a halogen lamp can be employed as a radiation source. The exposure dose is not particularly limited and one skilled in the art can easily determine the proper amount. In some embodiments, the exposure dose is at least about 100 mJ/cm$^2$ (e.g., at least about 250 mJ/cm$^2$, or at least about 500 mJ/cm$^2$) and at most about 2,000 mJ/cm$^2$ (e.g., at most about 1,500 mJ/cm$^2$ or at most about 1,000 mJ/cm$^2$). In one embodiment, the exposure dose is from 250 mJ/cm$^2$ to 1000 mJ/cm$^2$.

If the dielectric film is exposed to heating, the heating temperature is at least about 70° C. (e.g., at least about 100° C., at least about 130° C., or at least about 150° C.) and/or at most about 250° C. (e.g., at most about 220° C., at most about 200° C., or at most about 180° C.). The heating time is at least about 10 minutes (e.g., at least about 20 minutes, at least about 30 minutes, at least about 40 minutes, or at least about 50 minutes) and/or at most about 5 hours (e.g., at most about 4 hours, at most about 3 hours, at most about 2 hours, or at most about 1 hour). In one embodiment, the heating temperature is from 150° C. to 250° C. for 30 minutes to 3 hours.

A distinguished feature of the dielectric film of this disclosure is their surprisingly high optical transparency and low CTE. In some embodiment, the dielectric film of this disclosure has an optical transparency of at least about 50% (e.g., at least about 55%, at least about 60%, at least about 65%, at least about 70%, at least about 75%, at least about 80%, at least about 85%, at least about 88%, at least about 90%, at least about 92%, or at least about 94%). Optical transparency measures at wavelengths of 450 nm to 700 nm. In some embodiments, the dielectric film of this disclosure has a CTE of at most about 50 ppm/° C. (e.g., at most about 45 ppm/° C., at most about 40 ppm/° C., at most about 35 ppm/° C., or at most about 30 ppm/° C.) and/or at least about 10 ppm/° C. (e.g., at least about 15 ppm/° C., at least about 20 ppm/° C., or at least 25 ppm/° C.). CTE measured at temperature range of 50-150° C.

In some embodiments, this disclosure features a process for creating a patterned dielectric film that includes the steps of:

a) coating a dielectric film forming composition of this disclosure on a substrate to form a dielectric film;

b) exposing the dielectric film to a source of radiation or heat; and c) patterning the film to form a patterned dielectric film having openings.

Steps a) and b) can be the same as discussed earlier.

In some embodiments, the process to prepare a patterned dielectric film includes converting the dielectric film into a patterned dielectric film by a lithographic process. In such cases, the conversion can include exposing the dielectric film to high energy radiation (such as those described above) using a patterned mask. After the dielectric film is exposed to high energy radiation, the process can further include developing the exposed dielectric film to form a patterned dielectric film.

After the exposure, the dielectric film can be heat treated to at least about 50° C. (e.g., at least about 55° C., at least about 60° C., or at least about 65° C.) to at most about 100° C. (e.g., at most about 95° C., or at most about 90° C., at most about 85° C., at most about 80° C., at most about 75° C., or at most about 70° C.) for at least about 60 seconds (e.g., at least about 65 seconds, or at least about 70 seconds) to at most about 240 seconds (e.g., at most about 180 seconds, at most about 120 seconds or at most about 90 seconds). The heat treatment is usually accomplished by use of a hot plate or oven.

After the exposure and heat treatment, the dielectric film can be developed to remove unexposed portions by using a developer. Development can be carried out by, for example, an immersion method or a spraying method. Microholes and fine lines can be generated in the dielectric film on the laminated substrate after development.

In some embodiments, the dielectric film can be developed by use of an organic developer. Examples of such developers can include, but are not limited to, gamma-butyrolactone (GBL), dimethyl sulfoxide (DMSO), N,N-diethylacetamide, methyl ethyl ketone (MEK), methyl isobutyl ketone (MIBK), 2-heptanone, cyclopentanone (CP), cyclohexanone, n-butyl acetate (nBA), propylene glycol methyl ether acetate (PGMEA), propylene glycol methyl ether (PGME), ethyl lactate (EL), propyl lactate, 3-methyl-3-methoxybutanol, tetralin, isophorone, ethylene glycol monobutyl ether, diethylene glycol monoethyl ether, diethylene glycol monoethyl ether acetate, diethylene glycol dimethyl ether, diethylene glycol methylethyl ether, triethylene glycol monoethyl ether, dipropylene glycol monomethyl ether, methyl 3-methoxypropionate, ethyl 3-ethoxypropionate, diethyl malonate, ethylene glycol, 1,4:3,6-dianhydrosorbitol, isosorbide dimethyl ether, 1,4:3,6-dianhydrosorbitol 2,5-diethyl ether (2,5-diethylisosorbide) and mixtures thereof. Preferred developers are gamma-butyrolactone (GBL), cyclopentanone (CP), cyclohexanone, ethyl lactate (EL), n-butyl acetate (nBA) and dimethylsulfoxide (DMSO). More preferred developers are gamma-butyrolactone (GBL), cyclopentanone (CP) and cyclohexanone. These developers can be used individually or in combination of two or more to optimize the image quality for the particular composition and lithographic process.

In some embodiments, the dielectric film can be developed by using an aqueous developer. When the developer is an aqueous solution, it preferably contains one or more aqueous bases. Examples of suitable bases include, but are not limited to, inorganic alkalis (e.g., potassium hydroxide, sodium hydroxide), primary amines (e.g., ethylamine, n-propylamine), secondary amines (e.g. diethylamine, di-n-propylamine), tertiary amines (e.g., triethylamine), alcoholamines (e.g., triethanolamine), quaternary ammonium hydroxides (e.g., tetramethylammonium hydroxide or tetraethylammonium hydroxide), and mixtures thereof. The concentration of the base employed will vary depending on, e.g., the base solubility of the polymer employed. The most preferred aqueous developers are those containing tetramethylammonium hydroxide (TMAH). Suitable concentrations of TMAH range from about 1% to about 5%.

In some embodiments, after the development by an organic developer, an optional rinse treatment can be carried out with an organic rinse solvent. One skilled in the art will know which rinse method is appropriate for a given application. Suitable examples of organic rinse solvents include, but are not limited to, alcohols such as isopropyl alcohol, methyl isobutyl carbinol (MIBC), propylene glycol monomethyl ether (PGME), amyl alcohol, esters such as n-butyl acetate (nBA), ethyl lactate (EL) and propylene glycol monomethyl ether acetate (PGMEA), ketones such as methyl ethyl ketone, and mixtures thereof. A rinse solvent can be used to carry out the rinse treatment to remove residues.

In some embodiments, after the development step or the optional rinse treatment step, an optional baking step (e.g., post development bake) can be carried out at a temperature ranging from at least about 120° C. (e.g., at least about 130° C., at least about 140° C., at least about 150° C., at least about 160° C., at least about 170° C., or at least about 180° C.) to at most about 250° C. (e.g., at most about 240° C., at most about 230° C., at most about 220° C., at most about 210° C., at most about 200° C. or at most about 190° C.). The baking time is at least about 5 minutes (e.g., at least about 10 minutes, at least about 20 minutes, at least about 30 minutes, at least about 40 minutes, at least about 50 minutes, or at least about 60 minutes) and/or at most about 5 hours (e.g., at most about 4 hours, at most about 3 hours, at most about 2 hours, or at most about 1.5 hours). This baking step can remove residual solvent from the remaining dielectric film and can further crosslink the remaining dielectric film. Post development bake can be done in air or preferably, under a blanket of nitrogen and may be carried out by any suitable heating means.

In some embodiments, the process to prepare patterned dielectric film include converting the dielectric film into patterned dielectric film by a laser ablation technique. Direct laser ablation process with an excimer laser beam is generally a dry, one step material removal to form openings (or patterns) in the dielectric film. In some embodiments, the wavelength of the laser is 351 nm or less (e.g., 351 nm, 308 nm, 248 nm or 193 nm). Examples of suitable laser ablation processes include, but are not limited to, the processes described in U.S. Pat. Nos. 7,598,167, 6,667,551, and 6,114, 240, the contents of which are hereby incorporated by reference. Laser ablation processes using conventional dielectric films create large amounts of debris. Removal of this ablation debris often requires additional cleaning process steps by chemical and/or plasma treatment, which adds to the complexity and cost of the process. An advantage of the dielectric film of this disclosure is that when the dielectric film is patterned by laser ablation process, little or no debris is formed, which results in less process complexity and lower cost.

In some embodiments, the aspect ratio (i.e., the ratio of height to width) of the smallest feature of a patterned dielectric film is at most about 3/1 (e.g., at most about 2/1, at most about 1/1, at most about 1/2, or at most about 1/3) and/or at least about 1/25 (e.g., at least about 1/20, at least about 1/15, at least about 1/10 and at least about 1/5).

In some embodiments, the aspect ratio the smallest feature of a patterned dielectric film is at least about 1/2 (e.g., at least about 1/1, at least about 2/1 or at least about 3/1).

In general, the processes described above can be used to form an article to be used in a semiconductor device. Examples of such articles include a semiconductor substrate, a flexible film for electronics, a wire isolation, a wire coating, a wire enamel, or an inked substrate. Examples of semiconductor devices that can be made from such articles include an integrated circuit, a light emitting diode, a solar cell, and a transistor.

In some embodiments, this disclosure features a three dimensional object containing at least one patterned film formed by a process described herein. In some embodiments, the three dimensional object can include patterned films in at least two stacks (e.g., at least three stacks).

In some embodiments, the processes described above result in an article that includes an electronic substrate and a patterned dielectric film layer (e.g., containing a relief pattern) laminated onto the electronic substrate, in which the patterned dielectric film layer includes at least one polyimide polymer. In embodiments where the initial dielectric film thickness is 5 microns or less, the patterned dielectric film layer thus formed can have a film thickness of at most about 5 microns (e.g., at most about 4 microns or at most about 3 microns) and include at least one element having a feature size (e.g., width) of at most about 3 microns (e.g., at most about 2 microns).

The contents of all publications cited herein (e.g., patents, patent application publications, and articles) are hereby incorporated by reference in their entirety.

The following examples are provided to illustrate the principles and practice of the present disclosure more clearly. It should be understood that the present disclosure is not limited to the examples described.

EXAMPLES

Synthesis Example 1 (P-1)

Preparation of 6FDA/DAPI Polyimide

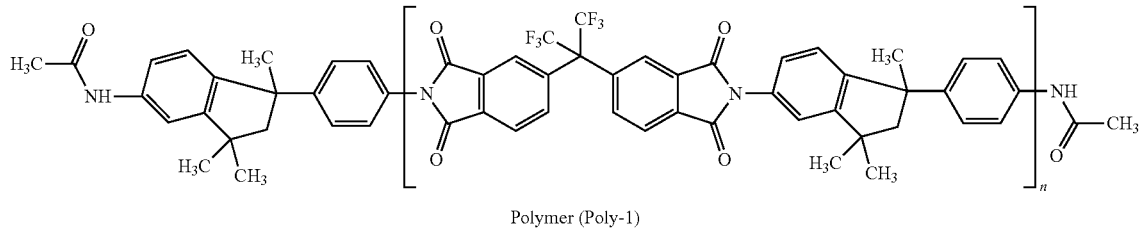

Polymer (Poly-1)

Solid 4,4'-(hexafluoroisopropylidene)bis(phthalic anhydride) (6FDA) (2.370 kg, 5.33 mole) was charged to a solution of 1-(4-aminophenyl)-1,3,3-trimethylindan-5-amine (also known as 4,4'-[1,4-phenylene-bis(1-methylethylidene)]bisaniline (DAPI)) (1.473 kg, 5.51 mole) in NMP (9.86 kg) at 25° C. The reaction temperature was increased to 40° C. and the mixture was allowed to react for 6 hours. Next, acetic anhydride (1.125 kg) and pyridine (0.219 kg) were added and the reaction temperature was increased to 100° C. and allowed to react for 12 hours.

The reaction mixture above was cooled to room temperature and transferred to a larger vessel equipped with a mechanical stirrer. The reaction solution was diluted with ethyl acetate and washed with water for one hour. After the stirring was stopped, the mixture was allowed to stand undisturbed. Once phase separation had occurred, the aqueous phase was removed. The organic phase was diluted with a combination of ethyl acetate and acetone and washed twice with water. The amounts of organic solvents (ethyl acetate and acetone) and water used in all of the washes are shown in Table 1.

TABLE 1

|  | Wash 1 | Wash 2 | Wash 3 |
| --- | --- | --- | --- |
| Ethyl Acetate (kg) | 20.5 | 4.1 | 4.1 |
| Acetone (kg) | — | 2.3 | 2.3 |
| Water (kg) | 22.0 | 26.0 | 26.0 |

Cyclopentanone (10.5 kg) was added to the washed organic phase and the solution was concentrated by vacuum distillation to give a polymer solution P-1. The solid % of final polymer was 32.96% and the weight average molecular weight (Mw) measured by GPC was 49,200 Daltons.

Formulation Examples 1-8 and Comparative Formulation Examples 1-2

Formulation Examples 1-8 and Comparative Formulation Examples 1-2 (FE-1 to FE-8 and CFE-1 to CFE-2) were prepared according to Table 2. Formulation components were mixed by mechanical stirring for 16-24 hours.

TABLE 2

| Formulation Example | Poly-1 (grams, 32.96% in cyclopentanone) | Crosslinker[1] (grams) | Silica[2] (grams) | MCA[3] (grams) | Initiator[4] (grams) | Adhesion Promoter[4] (grams) | Cyclohexanone (grams) | n-Butanol (grams) |
|---|---|---|---|---|---|---|---|---|
| FE-1 | 21.85 | 16.99 | 10.81 | 2.40 | 0.72 | 1.26 | 44.73 | 1.60 |
| FE-2 | 18.20 | 14.01 | 9.01 | 4.01 | 0.60 | 1.00 | 50.59 | 2.68 |
| FE-3 | 18.27 | 14.02 | 12.01 | 2.00 | 0.60 | 1.00 | 50.92 | 1.33 |
| FE-4 | 21.87 | 16.81 | 7.20 | 2.41 | 0.72 | 1.20 | 48.28 | 1.60 |
| FE-5 | 21.87 | 16.82 | 4.80 | 2.40 | 0.72 | 1.20 | 50.62 | 1.60 |
| FE-6 | 18.21 | 14.02 | 12.00 | 2.80 | 0.60 | 1.01 | 49.55 | 1.87 |
| CFE-1 | 21.85 | 16.79 | 9.84 | None | 0.72 | 1.19 | 49.66 | None |
| FE-7 | 21.85 | 16.80 | 3.12 | 2.41 | 0.72 | 1.20 | 32.31 | 1.60 |
| CFE-2 | 27.30 | 21.01 | None | 5.69 | 0.90 | 1.49 | 39.77 | 3.80 |
| FE-8 | 12.74 | 9.80 | 14.00 | 2.38 | 0.42 | 0.70 | 56.00 | 1.59 |

[1]CN992 (Sartomer)
[2]Silica is from Evonik and has a medium size of 0.2 microns
[3]Titanium carboxyethylacrylate (Purelight Labs)
[4]NCI-831 (Adeka Corp.)
[5]Methacryloxypropyltrimethoxysilane (Gelest)

Process Examples 1-8 and Comparative Process Examples 1-2

Self-standing dry films (SSDF) based on FE-1 to FE-8 and CFE-1 to CFE-2 were prepared by rod coating each composition on a polyethylene terephthalalate (PET) substrate and drying at 90° C. for 10 minutes. The films were exposed at 500 mJ/cm$^2$ using i-line exposure. Dry films with nominal film thicknesses of 20 microns were obtained. The resulting films were delaminated from the PET to form self-standing dry films. These self-standing dry films were placed onto a Kapton sheet and baked at 170° C. for 2 hours under vacuum. CTE values of the self-standing dry films were measured using a Q400 TMA thermomechanical analyzer (TMA), which is designed to accurately measure small changes in the dimensions of a self-standing dry film mounted on a probe as it is heated over a programmed temperature range. The CTE of longitudinal direction of film was measured in tensile mode. A sample of self-standing dry film with the width of 3 mm was prepared using a JDC precision sample cutter. This sample was mounted using a sample holder with length of 16 mm and placed on TMA Film expansion probe. The self-standing dry film was heated and CTE was calculated by using TA software. Table 3 shows the compositions of the self-standing dry films and the measured CTE values.

film. Specifically, Table 3 shows that, even with 28 weight % silica, when no MCA is present in the film, the CTE of the self-standing dry film in Comparative Process Example 1 was as high as 155 ppm/° C. when measured in the range from 50° C. to 150° C. Surprisingly, the presence of MCA in the self-standing dry films in Process Examples 1-6 lowered the CTE to 51 ppm/° C. or less.

Process Example 7, when compared with Process Examples 1-6 (Table 3), demonstrates the effect of the total silica and MCA loading in lowering the CTE of the self-standing dry film. The film in Process Example 7 included a total amount of silica and MCA of 18 wt % (i.e., 10 wt % silica and 8 wt % MCA). The test results show that this film exhibited a CTE of 62 ppm/° C. in the range from 50° C. to 150° C. Whereas, the films in Process Examples 1-6 included a total amount of silica and MCA of in the range of 21-40 wt %. The test results show that these films exhibited a CTE of 51 ppm/° C. or less.

Comparative Process Example 2, when compared with Process Examples 1-6 (Table 3), demonstrates the importance of using silica in combination with MCA to lower the CTE of the self-standing dry film. Specifically, Table 3 shows that, even with 15 wt % MCA, when no silica is present in the film, the CTE of the self-standing dry film in Comparative Process Example 2 was 83 ppm/° C. when measured in the range from 50° C. to 150° C. Surprisingly,

TABLE 3

| Process Example | Polyimide (Wt % in film) | Crosslinker[1] (Wt % in film) | Silica (Wt % in film) | MCA[2] (Wt % in film) | CTE (ppm/° C.) (50-150° C.) |
|---|---|---|---|---|---|
| PE-1 | 18 | 43 | 28 | 6 | 51 |
| PE-2 | 17 | 40 | 26 | 12 | 48 |
| PE-3 | 17 | 39 | 34 | 6 | 40 |
| PE-4 | 20 | 47 | 20 | 7 | 33 |
| PE-5 | 22 | 51 | 14 | 7 | 41 |
| PE-6 | 16 | 38 | 33 | 8 | 26 |
| CPE-1 | 20 | 47 | 28 | None | 155 |
| PE-7 | 23 | 53 | 10 | 8 | 62 |
| CPE-2 | 24 | 55 | None | 15 | 83 |
| PE-8 | 13 | 31 | 44 | 8 | Translucent and brittle film |

[1]CN992 (Sartomer)
[2]Titanium carboxyethylacrylate (Purelight Labs)

Comparative Process Example 1, when compared with Process Examples 1-6 (Table 3), demonstrates the importance of using MCA to lower the CTE of the self-standing the presence of both silica and MCA in the self-standing films in Process Examples 1-6 lowered the CTE to 51 ppm/° C. or less.

Process Example 8 shows that, when the total amount of filler (e.g., silica) and MCA exceeds 50 wt % of the total weight of the self-standing film, the resulting film became translucent and brittle. As a result, its CTE could not be measured. Therefore, it is believed that the low CTE in the Process Examples 1-6 described above cannot be achieved by only increasing the amount of filler (e.g., silica), and an appropriate amount of a combination of filler (e.g., silica) and MCA is essential to achieve low CTE, transparent and tough self-standing dry films.

Dielectric Constant Measurement Example 1

Self-standing dry film was prepared by rod coating of composition FE-1 on a polyethylene terephthalalate (PET) substrate and drying at 90° C. for 10 minutes. A dry film with the film thickness of 25 microns was achieved. The resulting dry film was baked in a dry chamber at 105° C. for 2 hours. Using the split cylinder resonator method (IPC-TM-650, test number 2-5-5-13), the dielectric constant and loss tangent of two stacks of the dry film were measured as shown in the Table 4.

TABLE 4

| Number of stacks of dry film | Frequency (GHz) | Dielectric constant | Udk | Loss tangent | Udf |
|---|---|---|---|---|---|
| 7 | 7.11 | 3.05 | 0.28 | 0.0275 | 0.0018 |
| 9 | 7.09 | 3.06 | 0.22 | 0.0273 | 0.0015 |

In Table 4, Udk is uncertainty of dielectric constant measurement and Udf is uncertainty of lass tangent measurement. The results in Table 4 show that the dry films prepared from FE-1 exhibited acceptable dielectric properties for semiconductor packaging applications.

Formulation Example 9

Formulation Example 9 (FE-9) was prepared by using 13.00 g of polymer (Poly-1), 27.36 g cyclopentanone, 31.20 g cyclohexanone, 1.73 g n-butanol, 0.65 g of methacryloxypropyl trimethoxysilane, 0.39 g of NCI-831, 2.60 g of titanium carboxyethyl acrylate, 7.80 g of surface treated silica, 13 g of tetraethylene glycol diacrylate (SR 268), 1.46 g of trimethylolpropane triacrylate, (SR 351LV), 0.78 g of 0.05% solution of Polyfox 6320 in cyclopentanone, and 0.03 g of p-benzoquinone. After being stirred mechanically for 24 hours, the formulation was used for the following tests.

Lithography Process Example 1

The photosensitive FE-9 was spin coated on a silicon wafer and baked at 70° C. for 180 seconds using a hot plate to form a coating with a thickness of about 15 microns. The photosensitive polyimide film was exposed with a broadband UV exposure tool (Carl Süss MA-56) through a mask having a desired pattern for exposure. After the exposure, the exposed film was heated at 50° C. for 3 minutes.

After the post exposure bake, unexposed portions were removed by using cyclopentanone as a developer (2×75 seconds of development), followed by rinsing the developed film with PGMEA for 15 seconds to form a pattern. A resolution of 20 microns at a photospeed of 250 mJ/cm² was achieved. Patterned features in the film exhibited an aspect ratio of 15/20 or 0.75.

Laser Ablation Process Example 1

FE-6 (Table 2) was spin coated on a silicon wafer and baked at 95° C. for 10 minutes using a hot plate to form a coating with a thickness of about 10.50 microns). The film was then flood exposed with a broadband UV exposure tool (Carl Süss MA-56) at 500 mJ/cm². The film was laser ablated by using XeCl laser at a wavelength of 308 nm at a frequency of 100 Hz. A resolution of 8 microns was achieved and the etch rate of 1.258 nm/pulse was obtained at 900 mJ/cm². Patterned features in the film exhibited an aspect ratio of 10/8 or 1.25.

Optical Transparency Measurement Example 1

FE-6 (Table 2) was spin coated on top of a transparent 4" glass wafers at thickness of 3.0 um and soft baked at 95° C. for 180 seconds. The absorbance of this self-standing dry film was measured by using a CARY 400 Conc UV-Visible Spectrophotometer within the range of wavelengths from 450 nm to 700 nm was used. Transparency of this film was 98.8% at 700 nm, 98.1% at 600 nm, 92.3% at 500 nm, and 89.4% at 400 nm. In other words, the film formed by FE-6 exhibited excellent transparency over the entire visible spectrum.

Optical Absorbance Measurement Example 2

FE-6 (Table 2) was spin coated on top of a transparent 4" glass wafers at thickness of 3.0 um and soft baked at 95° C. for 180 seconds. The Absorbance of this self-standing dry film was measured by using a CARY 400 Conc UV-Visible Spectrophotometer within the range of wavelengths from 300 to 405 nm. Absorbance of this film was 0.248 $\mu m^{-1}$ at 308 nm, 0.094 $\mu m^{-1}$ at 355 nm, 0.094 $\mu m^{-1}$ at 365 nm, 0.048 $\mu m^{-1}$ at 405 nm. In other words, the film formed by FE-6 exhibited relatively low absorbance over the tested UV spectrum.

Dry Film Example DF-1

Photosensitive solution of FE-1 (Table 2) was applied using reverse microbar coater from Fujifilm USA (Greenwood, S.C.) with line speed of 2 feet/minutes (61 cm per minutes) with 60 microns microbar clearance onto a polyethylene terephthalate (PET) film (TA 30, manufactured by Toray Plastics America, Inc.) having a width of 16.2" and thickness of 35 microns used as a carrier substrate and dried at 194° F. to obtain a photosensitive polymeric layer with a thickness of approximately 37.0 microns. On this polymeric layer, a biaxially oriented polypropylene film having width of 16" and thickness of 30 microns (BOPP, manufactured by Impex Global, Houston, Tex.) was laid over the photosensitive polymeric layer by a roll compression to act as a protective layer. A dry film (DF-1) thus formed contained a carrier substrate, a polymeric layer, and a protective layer.

Lamination of Dry Film (Example L1)

After the removal of the protective layer by peeling, the photosensitive polymeric layer of dry film structure DF-1 (6"×6") was placed on 4" Wafernet copper coated wafer. The polymeric layer was successfully laminated onto the Cu coated wafer by vacuum lamination (0.2-0.4 Torr) for 20 seconds, followed by being subjected to both a pressure of 40 psi and vacuum of 0.2-0.4 Torr for 180 seconds. The lamination temperature was 90° C. Lamination process was

Formulation Example 10

Formulation Example 10 (FE-10) is prepared by using 26.00 g of polymer (Poly-1), 46.88 g of cyclopentanone, 80.00 g of cyclohexanone, 0.78 g of 3-(triethoxysilyl)propylsuccinic anhydride, 1.30 g of 1-(O-acetyloxime)-1-[9-ethyl-6-(2-methylbenzoyl)-9H-carbazol-3-yl]ethanone (OXE-02, available from BASF), 6.20 g of zirconium carboxyethyl acrylate, 10.50 g of alumina with medium size of 0.5 microns, 13 g of tetraethylene glycol dimethacrylate (SR 209, available from Sartomer), 16.99 g of CN992 (available from Sartomer), 0.78 g of 0.05% solution of Polyfox 6320 in cyclopentanone, and 0.06 g of p-benzoquinone. After being stirred mechanically for 24 hours, the formulation is used without filtration

Process Example 9

Self-standing dry films (SSDF) based on FE-10 is prepared by rod coating on a polyethylene terephthalalate (PET) substrate and drying at 95° C. for 8 minutes. The film is exposed at 500 mJ/cm$^2$ using i-line exposure. Dry film is obtained. The resulting film is delaminated from the PET to form a self-standing dry film.

Formulation Example 11

Formulation Example 11 (FE-11) is prepared by using 26.00 g of polymer (Poly-1), 46.88 g of cyclopentanone, 80.00 g of cyclohexanone, 0.78 g of gamma-glydoxypropyltrimethoxy silane, 1.30 g of 2-(Benzoyloxyimino)-1-[4-(phenylthio)phenyl]-1-octanone (OXE-01, available from BASF), 7.00 g of hafnium tetra(meth)acrylate, 10.50 g of titania with medium size of 0.4 microns, 15 g of triethylene glycol dimethacrylate (SR 205, available from Sartomer), 18.00 g of dipentaerythritol pentaacrylate CN992, 0.78 g of 0.05% solution of Polyfox 6320 in cyclopentanone, and 0.06 g of p-benzoquinone. After being stirred mechanically for 36 hours, the formulation is used without filtration

Process Example 10

Self-standing dry films (SSDF) based on FE-11 is prepared by rod coating on a polyethylene terephthalalate (PET) substrate and drying at 85° C. for 12 minutes. The film is exposed at 600 mJ/cm$^2$ using i-line exposure. Dry film is obtained. The resulting film is delaminated from the PET to form a self-standing dry film.

Formulation Example 12

Formulation Example 12 (FE-12) is prepared by using 13.00 g of polymer (Poly-1), 23.44 g of cyclopentanone, 39.00 g of cyclohexanone, 0.39 g of methacryloxymethyl triethoxysilane, 0.8 g of benzoyl peroxide, 4.00 g of titanium butoxide tri(meth)acrylate, 5.00 g of niobium oxide with medium size of 0.6 microns, 7.0 g of triethylene glycol diacrylate, 8.00 g of pentaerythritol diacrylate, 0.4 g of 0.05% solution of Polyfox 6320 in cyclopentanone, and 0.03 g of p-benzoquinone. After being stirred mechanically for 30 hours, the formulation is used without filtration

Process Example 11

Self-standing dry films (SSDF) based on FE-12 is prepared by rod coating on a polyethylene terephthalalate (PET) substrate and drying at 90° C. for 12 minutes. The film is exposed at 550 mJ/cm$^2$ using i-line exposure. Dry film is obtained. The resulting film is delaminated from the PET to form a self-standing dry film.

What is claimed is:

1. A dielectric film-forming composition, comprising:
   a) at least one fully imidized polyimide polymer;
   b) at least one inorganic filler;
   c) at least one metal-containing (meth)acrylate; and
   d) at least one catalyst capable of inducing polymerization reaction;
   wherein the total amount of the at least one inorganic filler and the at least one metal-containing (meth)acrylate is in the range of from about 20 wt % to about 50 wt % of the amount of solid in the composition.

2. The composition of claim 1, wherein the at least one inorganic filler comprises an inorganic particle selected from the group consisting of silica, alumina, titania, zirconia, hafnium oxide, CdSe, CdS, CdTe, CuO, zinc oxide, lanthanum oxide, niobium oxide, tungsten oxide, strontium oxide, calcium titanium oxide, sodium titanate, barium sulfate, barium titanate, barium zirconate, and potassium niobate.

3. The composition of claim 2, wherein the inorganic particle has a particle size of from about 0.1 microns to about 2 microns.

4. The composition of claim 1, wherein the at least one inorganic filler is in an amount of from about 2% by weight to about 20% by weight of the composition.

5. The composition of claim 1, wherein the metal atom of the at least one metal-containing (meth)acrylate is selected from the group consisting of titanium, zirconium, hafnium, and germanium.

6. The composition of claim 1, wherein the at least one metal-containing (meth)acrylate comprises at least one metal atom and at least one (meth)acrylate group.

7. The composition of claim 1, wherein the at least one metal-containing (meth)acrylate comprises titanium tetra (meth)acrylate, zirconium tetra(meth)acrylate, hafnium tetra (meth)acrylate, titanium butoxide tri(meth)acrylate, titanium dibutoxide di(meth)acrylate, titanium tributoxide (meth)acrylate, zirconium butoxide tri(meth)acrylate, zirconium dibutoxide di(meth)acrylate, zirconium tributoxide (meth)acrylate, hafnium butoxide tri(meth)acrylate, hafnium dibutoxide di(meth)acrylate, hafnium tributoxide (meth)acrylate, titanium tetra(carboxyethyl (meth)acrylate), zirconium tetra(carboxyethyl (meth)acrylate), hafnium tetra (carboxyethyl (meth)acrylate), titanium butoxide tri(carboxyethyl (meth)acrylate), titanium dibutoxide di(carboxyethyl (meth)acrylate), titanium tributoxide (carboxyethyl (meth)acrylate), zirconium butoxide tri(carboxyethyl (meth) acrylate), zirconium dibutoxide di(carboxyethyl (meth)acrylate), zirconium tributoxide (carboxyethyl (meth)acrylate), hafnium butoxide tri(carboxyethyl (meth)acrylate), hafnium dibutoxide di(carboxyethyl (meth)acrylate), or hafnium tributoxide (carboxyethyl (meth)acrylate).

8. The composition of claim 1, wherein the at least one metal-containing (meth)acrylate is in an amount of from about 0.5 wt % to about 20 wt % of the composition.

9. The composition of claim 1, wherein the weight ratio between at least one inorganic filler and at least one metal-containing (meth)acrylate is from about 1:1 to about 5:1.

10. The composition of claim 1, wherein the at least one fully imidized polyimide polymer is in an amount of from about 3 wt % to about 40 wt % of the composition.

11. The composition of claim 1, wherein the at least one catalyst comprises a photoinitiator or a thermal initiator.

12. The composition of claim 1, wherein the at least one catalyst is in an amount of from about 0.25 wt % to about 4 wt % of the composition.

13. The composition of claim 1, further comprising at least one solvent.

14. The composition of claim 13, wherein the at least one solvent is in an amount of from about 35 wt % to about 98 wt % of the composition.

15. The composition of claim 1, further comprising at least one crosslinker.

16. The composition of claim 15, wherein the crosslinker comprises two or more alkenyl or alkynyl groups.

17. The composition of claim 15, wherein the crosslinker is a urethane (meth)acrylate.

18. The composition of claim 15, wherein the crosslinker is in an amount of from about 2.5 wt % to about 30 wt % of the composition.

19. A dielectric film formed by the composition of claim 1.

20. A dry film, comprising:
a carrier substrate; and
the dielectric film of claim 19 supported by the carrier substrate.

21. A dielectric film, comprising:
a) at least one fully imidized polyimide polymer;
b) at least one inorganic filler; and
c) at least one crosslinked metal-containing (meth)acrylate;
wherein the total amount of the at least one inorganic filler and the at least one metal-containing (meth)acrylate is in the range of from about 20 wt % to about 50 wt % of the film.

22. The dielectric film of claim 21, wherein the total amount of the at least one inorganic filler and the at least one crosslinked metal-containing (meth)acrylate is at least about 25 wt % of the film.

23. The dielectric film of claim 22, wherein the total amount of the at least one inorganic filler and the at least one cross-linked metal-containing (meth)acrylate is at most about 45 wt % of the film.

24. The dielectric film of claim 21, wherein the dielectric film has a CTE of at most about 50 ppm/° C.

25. The dielectric film of claim 21, wherein the dielectric film has an optical transparency of at least 50%.

26. The dielectric film of claim 21, wherein the dielectric film has a CTE of at most about 50 ppm/° C. and an optical transparency of at least 50%.

27. The dielectric film of claim 21, wherein the dielectric film is a patterned film.

28. The dielectric film of claim 21, wherein the dielectric film is a self-standing dielectric film.

29. A three dimensional object comprising the dielectric film of claim 21.

30. A semiconductor device, comprising the three dimensional object of claim 29.

31. The semiconductor device of claim 30, wherein the semiconductor device is an integrated circuit, a light emitting diode, a solar cell, or a transistor.

32. A process for producing a patterned dielectric film, comprising the steps of:
a) coating the dielectric film forming composition of claim 1 to form a dielectric film; and
b) patterning the dielectric film by a laser ablation process or a lithography process to formed a patterned dielectric film.

33. A three dimensional object formed by the process of claim 32.

34. A semiconductor device, comprising the three dimensional object of claim 33.

35. The semiconductor device of claim 34, wherein the semiconductor device is an integrated circuit, a light emitting diode, a solar cell, or a transistor.

36. A self-standing dielectric film, comprising:
a) at least one fully imidized polyimide polymer;
b) at least one inorganic filler;
c) at least one metal-containing (meth)acrylate; and
d) at least one catalyst capable of inducing polymerization reaction;
wherein the total amount of the at least one inorganic filler and the at least one metal-containing (meth)acrylate is in the range of from about 20 wt % to about 50 wt % of the film.

37. The composition of claim 1, wherein the at least one fully imidized polyimide polymer comprises an indanyl group.

* * * * *

UNITED STATES PATENT AND TRADEMARK OFFICE
CERTIFICATE OF CORRECTION

| | | |
|---|---|---|
| PATENT NO. | : 10,563,014 B2 | Page 1 of 1 |
| APPLICATION NO. | : 15/907332 | |
| DATED | : February 18, 2020 | |
| INVENTOR(S) | : Sanjay Malik, William A. Reinerth and Binod B. De | |

It is certified that error appears in the above-identified patent and that said Letters Patent is hereby corrected as shown below:

In the Claims

Column 27, Line 39:
In Claim 23, delete "cross-linked" and insert -- crosslinked --

Column 28, Line 21:
In Claim 32, delete "formed" and insert -- form --

Signed and Sealed this
Twenty-eighth Day of April, 2020

Andrei Iancu
*Director of the United States Patent and Trademark Office*